US012690342B2

(12) United States Patent
Saitoh et al.

(10) Patent No.: US 12,690,342 B2
(45) Date of Patent: Jul. 21, 2026

(54) DISPLAY DEVICE

(71) Applicant: Sharp Display Technology Corporation, Kameyama City (JP)

(72) Inventors: Takao Saitoh, Kameyama City (JP); Yohsuke Kanzaki, Kameyama City (JP); Masaki Yamanaka, Kameyama City (JP); Masahiko Miwa, Kameyama City (JP); Yi Sun, Kameyama City (JP); Masaki Fujiwara, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 382 days.

(21) Appl. No.: 18/280,941

(22) PCT Filed: Mar. 26, 2021

(86) PCT No.: PCT/JP2021/012855
§ 371 (c)(1),
(2) Date: Sep. 7, 2023

(87) PCT Pub. No.: WO2022/201487
PCT Pub. Date: Sep. 29, 2022

(65) Prior Publication Data
US 2024/0155883 A1 May 9, 2024

(51) Int. Cl.
*H10K 59/124* (2023.01)
*H10K 59/131* (2023.01)
(Continued)

(52) U.S. Cl.
CPC ......... *H10K 59/124* (2023.02); *H10K 59/131* (2023.02); *H10K 59/353* (2023.02); *H10K 59/65* (2023.02)

(58) Field of Classification Search
CPC ...... H10K 59/131; H10K 59/65; H10K 59/00; H10K 59/353; H10K 59/124; H10K 50/00; G09F 9/30
See application file for complete search history.

(56) References Cited

U.S. PATENT DOCUMENTS

2011/0199564 A1    8/2011    Moriwaki
2014/0092354 A1    4/2014    Moriwaki
(Continued)

FOREIGN PATENT DOCUMENTS

CN        112490274 A      3/2021
KR    10-2020-0037029 A    4/2020
(Continued)

*Primary Examiner* — Vongsavanh Sengdara
(74) *Attorney, Agent, or Firm* — ScienBiziP, P.C.

(57) ABSTRACT

A display device includes a display panel including a base substrate layer, a thin film transistor layer, a light-emitting element layer, and a sealing film, and includes an image capturing unit provided on the base substrate layer side of a display region of the display panel. A plurality of subpixels constituting the display region are divided into a group of normal subpixels provided so as not to overlap with the image capturing unit and a group of thinned-out subpixels provided so as to overlap with the image capturing unit. The inorganic insulating film is provided with openings passing through the inorganic insulating film, in an image capturing region overlapping with the group of thinned-out subpixels.

12 Claims, 12 Drawing Sheets

(51) Int. Cl.
    *H10K 59/35*          (2023.01)
    *H10K 59/65*          (2023.01)

(56)            References Cited

U.S. PATENT DOCUMENTS

| | | | |
|---|---|---|---|
| 2014/0166999 | A1 | 6/2014 | Kim et al. |
| 2015/0340418 | A1 | 11/2015 | Moriwaki |
| 2021/0020112 | A1 | 1/2021 | Ueno |
| 2021/0175303 | A1* | 6/2021 | Bang .................... H10K 59/122 |
| 2021/0210583 | A1 | 7/2021 | Okabe et al. |
| 2021/0408182 | A1 | 12/2021 | Chung et al. |
| 2022/0102421 | A1* | 3/2022 | Yang .................... H10H 20/857 |

FOREIGN PATENT DOCUMENTS

| | | | |
|---|---|---|---|
| WO | 2010038514 | A1 | 4/2010 |
| WO | 2019198163 | A1 | 10/2019 |
| WO | 2019224917 | A1 | 11/2019 |

* cited by examiner

DISPLAY DEVICE

TECHNICAL FIELD

The disclosure relates to a display device.

BACKGROUND ART

In recent years, a self-luminous type organic electroluminescence (hereinafter also referred to as EL) display device using an organic EL element has attracted attention as a display device that can replace liquid crystal display devices. For this organic EL display device, there has been proposed a structure in which, for example, an image capturing unit such as a camera is provided inside a display region in which an image is displayed.

For example, PTL 1 discloses a display device in which scanning signal lines and data signal lines extending to a display area are provided around a light transmission region for image capturing inside the display area so as to avoid the light transmission region.

CITATION LIST

Patent Literature

PTL 1: WO 2019/198163 Pamphlet (FIG. 4)

SUMMARY

Technical Problem

Incidentally, in an organic EL display device including an image capturing unit inside a display region, since subpixels constituting the display region are thinned out in the image capturing unit in order to increase the transmittance, there is a tendency for a lighting failure to easily occur in a thinned-out subpixel or a subpixel adjacent thereto.

The disclosure has been made in view of the above, and an object of the disclosure is to suppress the occurrence of a lighting failure in a thinned-out subpixel and a subpixel adjacent thereto.

Solution to Problem

In order to achieve the object described above, a display device according to the disclosure includes a display panel including a base substrate layer, a thin film transistor layer provided on the base substrate layer and formed by a first wiring line layer, a first flattening film, an inorganic insulating film, a second wiring line layer, and a second flattening film sequentially layered, a light-emitting element layer provided on the thin film transistor layer and formed by a plurality of first electrodes, a plurality of light-emitting function layers, and a common second electrode sequentially layered to correspond to a plurality of subpixels constituting a display region, and a sealing film provided on the light-emitting element layer, and an image capturing unit provided on the base substrate layer side of the display region of the display panel. The plurality of subpixels are divided into a group of normal subpixels provided not overlapping with the image capturing unit, and a group of thinned-out subpixels provided overlapping with the image capturing unit and thinned out compared with the group of normal subpixels, and in the inorganic insulating film, an opening is provided passing through the inorganic insulating film, in an image capturing region overlapping the group of thinned-out subpixels.

Advantageous Effects of Disclosure

According to the disclosure, it is possible to suppress the occurrence of a lighting failure in a thinned-out subpixel and a subpixel adjacent thereto.

DESCRIPTION OF EMBODIMENTS

Embodiments of a technique according to the disclosure will be described below in detail with reference to the drawings. Note that the technique according to the disclosure is not limited to the embodiments to be described below.

First Embodiment

Figure 1:
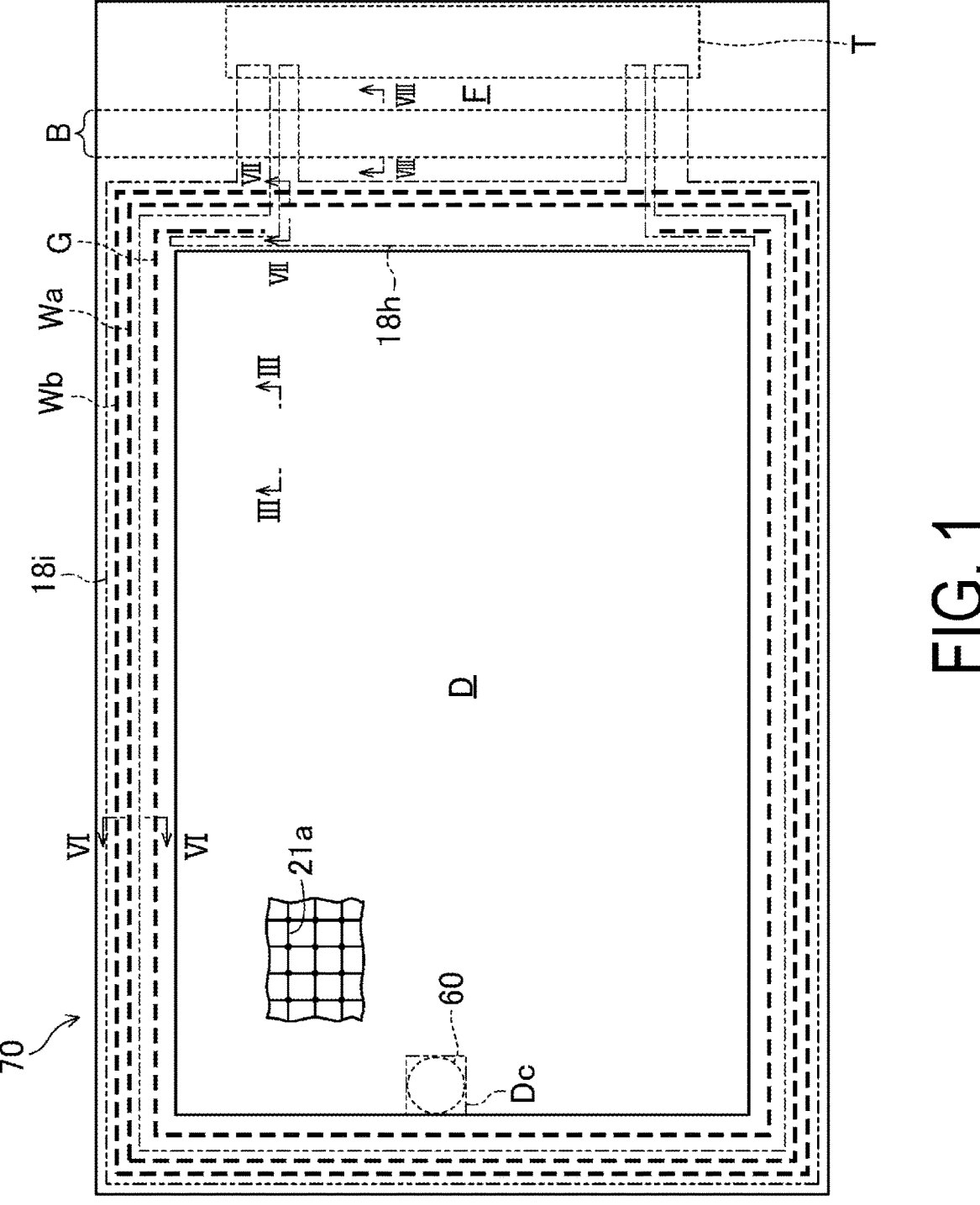
FIG. 1 is a plan view illustrating a schematic configuration of an organic EL display device according to a first embodiment of the disclosure.
Figure 2:
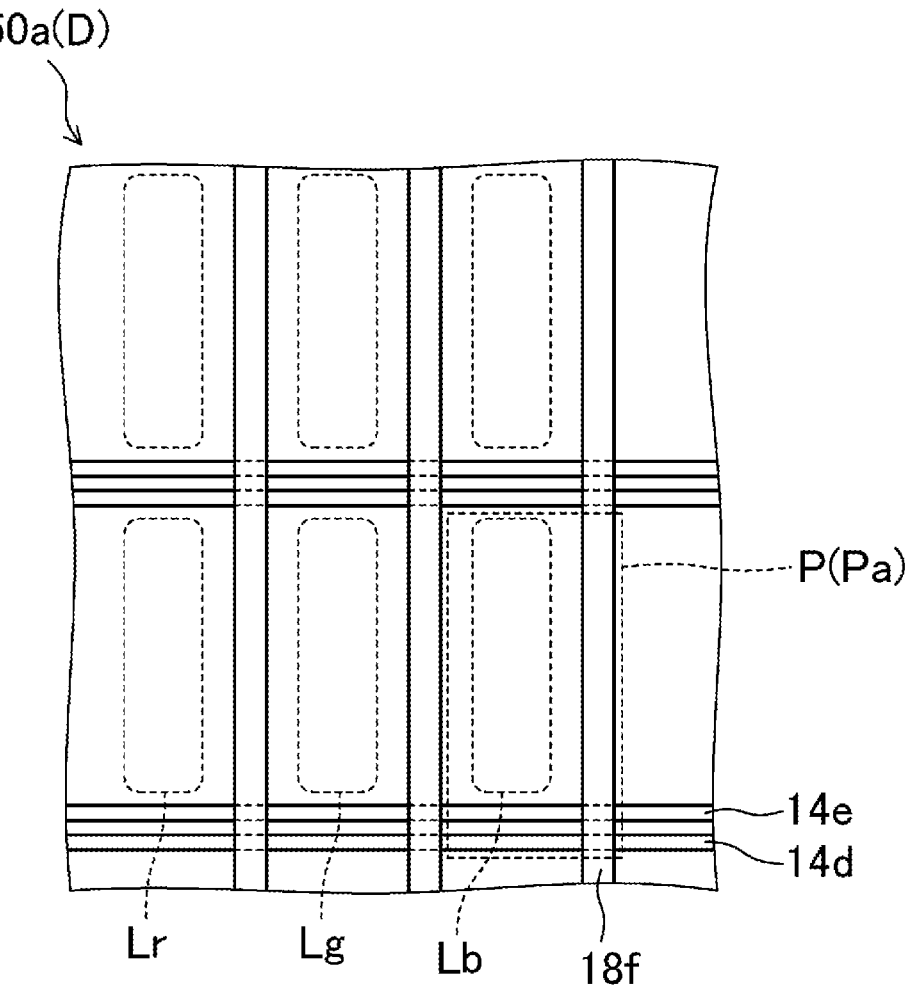
FIG. 2 is a plan view of a display region of an organic EL display panel constituting the organic EL display device according to the first embodiment of the disclosure.
Figure 3:
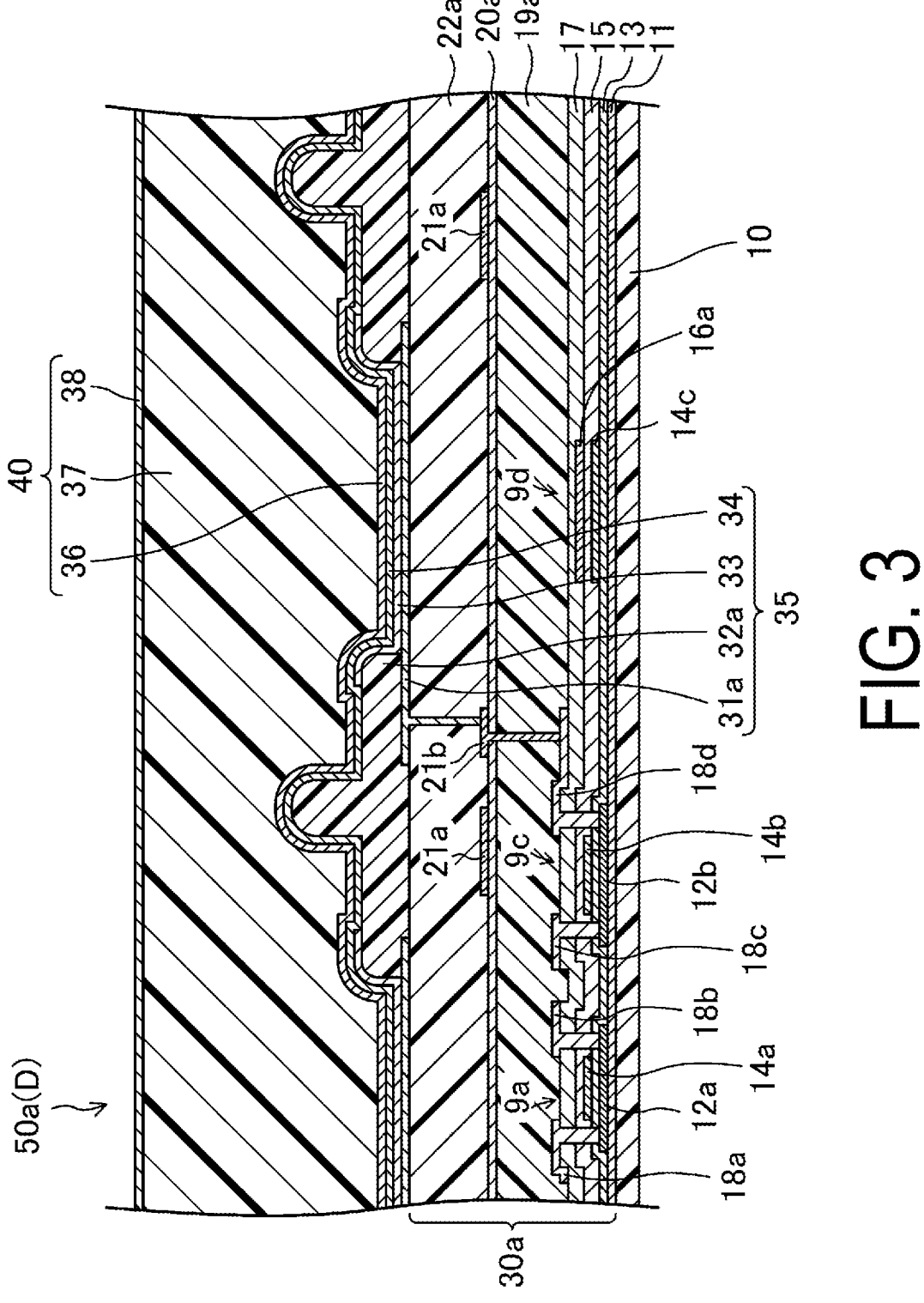
FIG. 3 is a cross-sectional view of the display region of the organic EL display panel taken along a line in FIG. 1.
Figure 4:
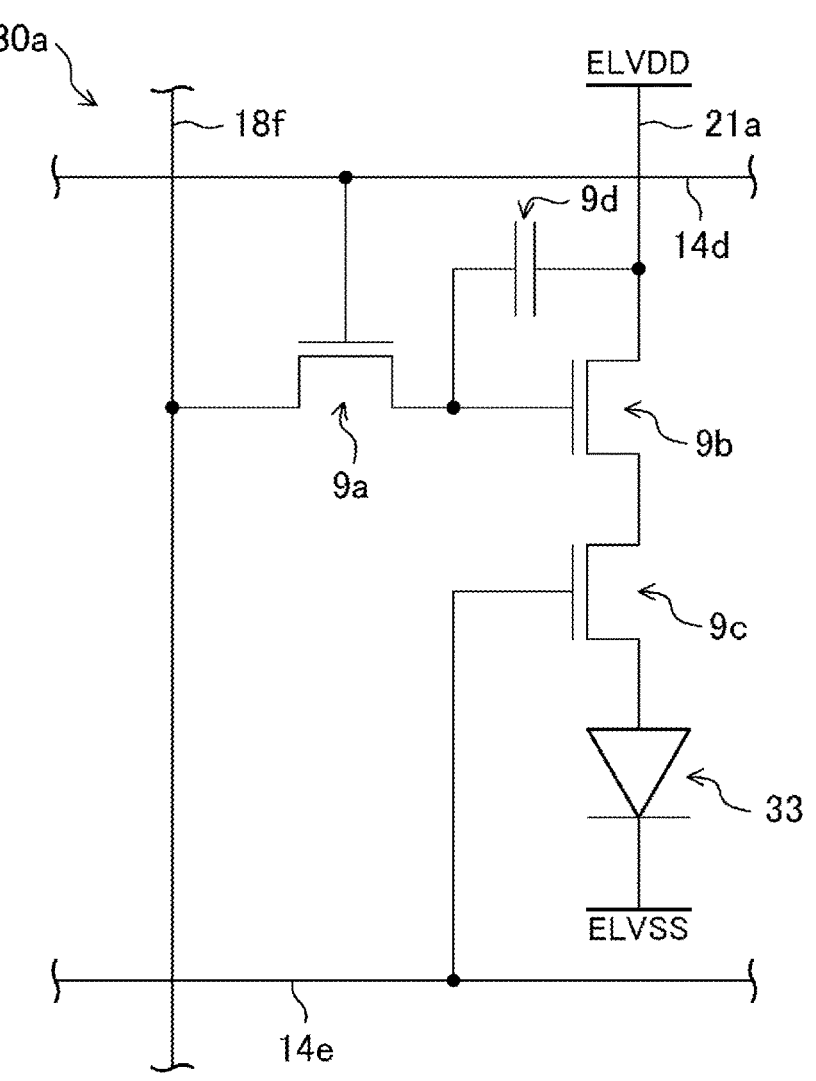
FIG. 4 is an equivalent circuit diagram of a thin film transistor layer constituting the organic EL display panel of the organic EL display device according to the first embodiment of the disclosure.
Figure 5:
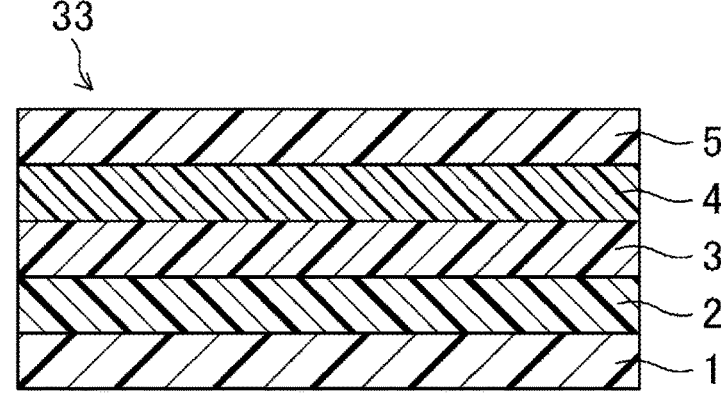
FIG. 5 is a cross-sectional view of an organic EL layer constituting the organic EL display panel of the organic EL display device according to the first embodiment of the disclosure.
Figure 6:
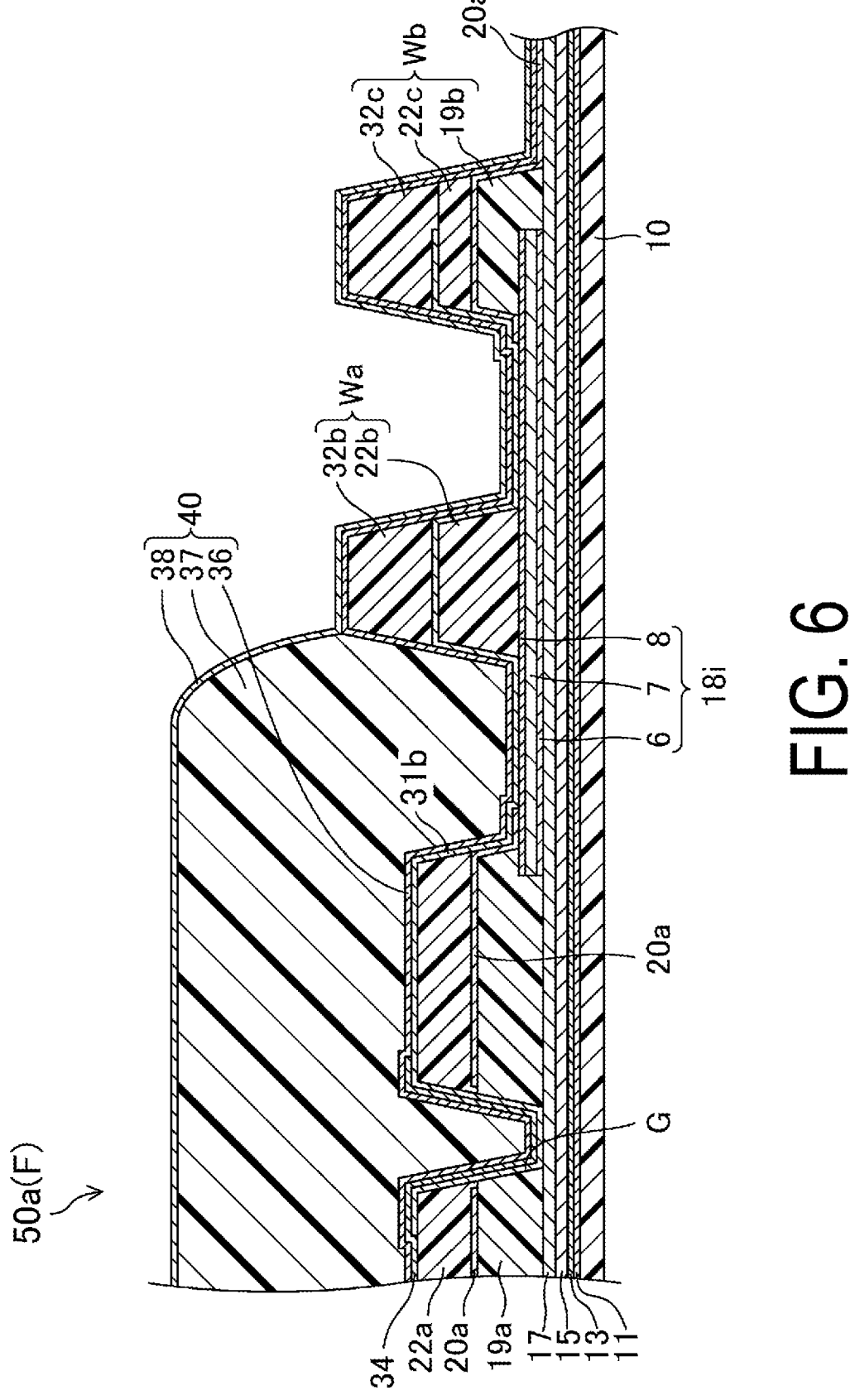
FIG. 6 is a cross-sectional view of a frame region of the organic EL display panel taken along a line VI-VI in FIG. 1.
Figure 7:
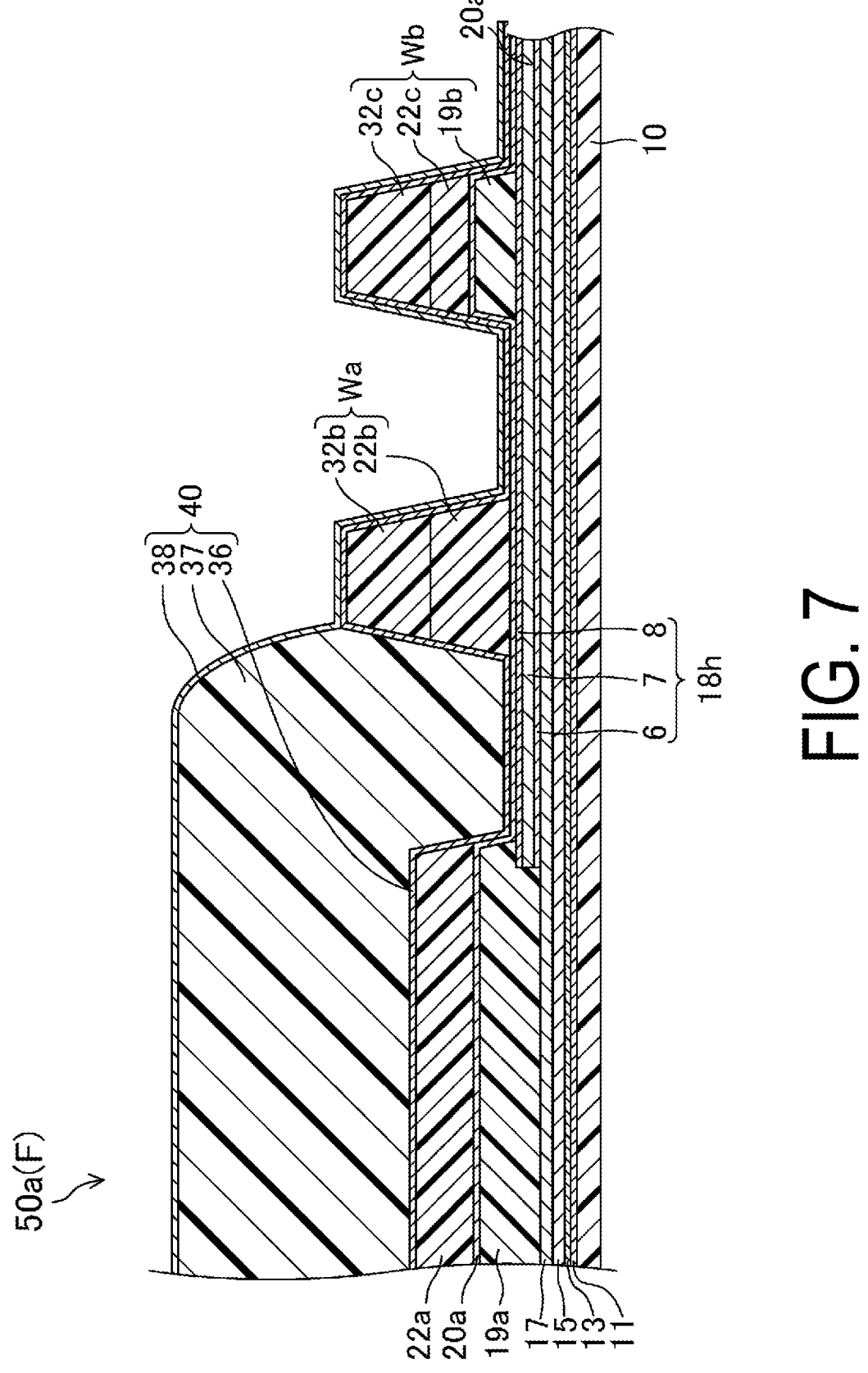
FIG. 7 is a cross-sectional view of the frame region of the organic EL display panel taken along a line VII-VII in FIG. 1.
Figure 8:
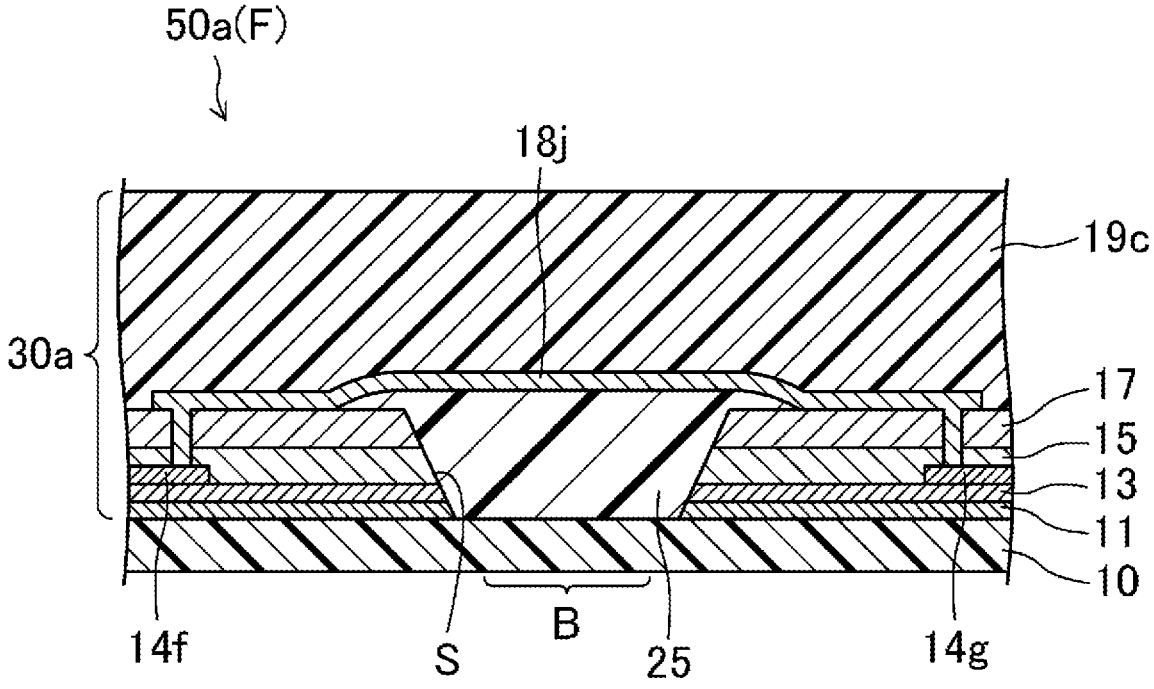
FIG. 8 is a cross-sectional view of the frame region of the organic EL display panel taken along a line VIII-VIII in FIG. 1.
Figure 9:
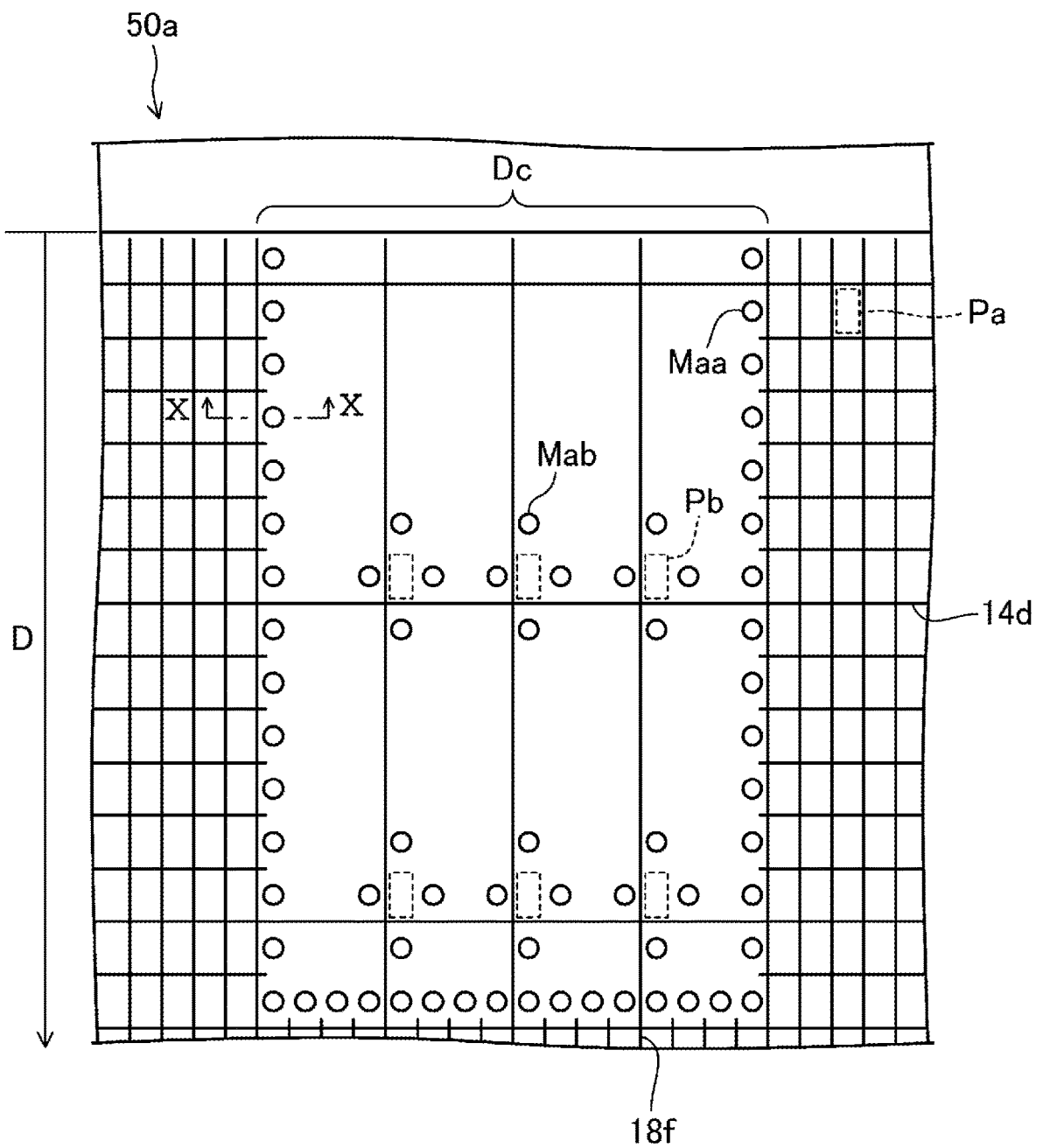
FIG. 9 is a plan view of an image capturing region of the organic EL display panel constituting the organic EL display device according to the first embodiment of the disclosure, and of the periphery of the image capturing region.
Figure 10:
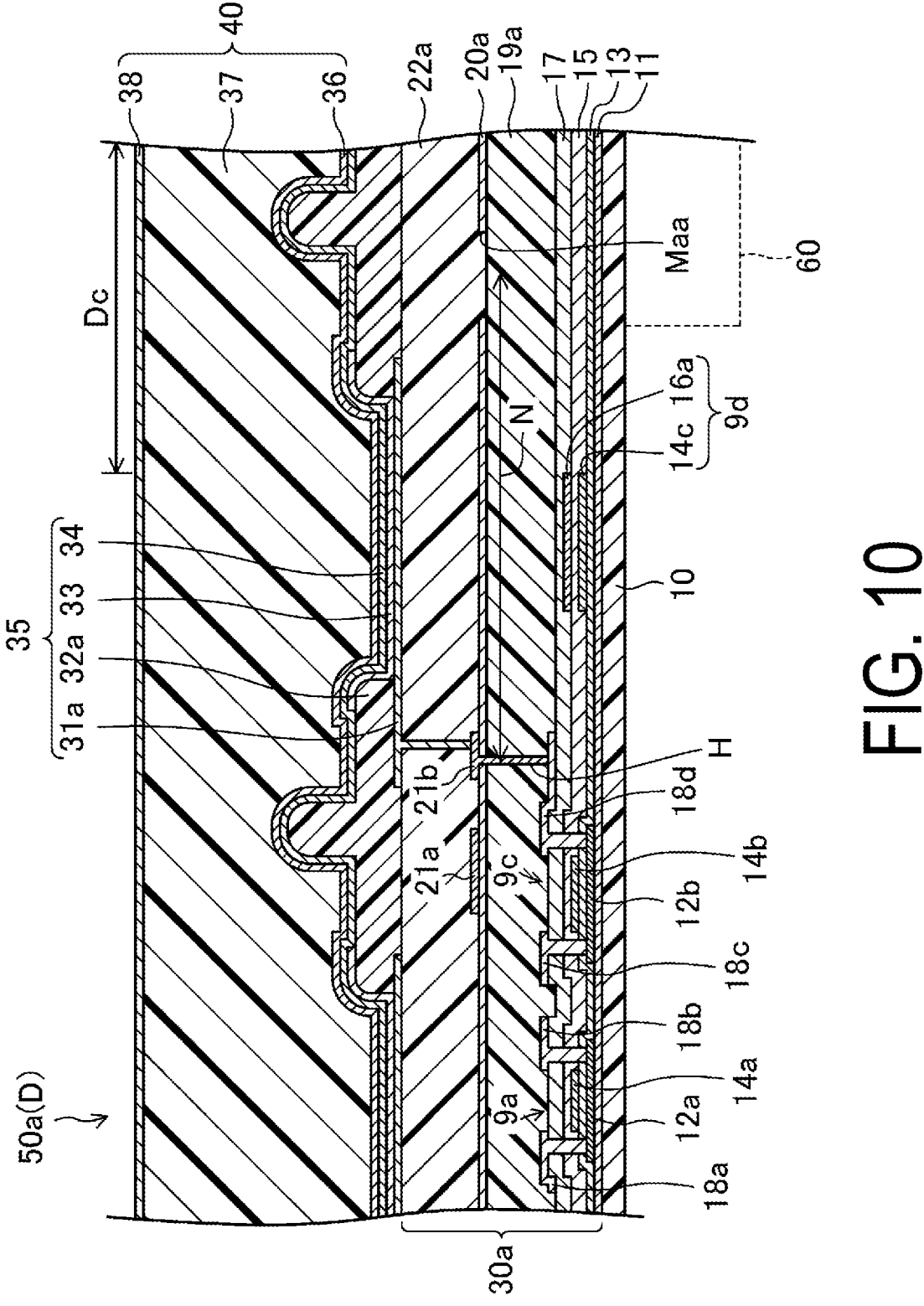
FIG. 10 is a cross-sectional view of the image capturing region of the organic EL display panel and the periphery of the image capturing region, taken along a line X-X in FIG. 9.

FIG. 1 to FIG. 10 illustrate a first embodiment of a display device according to the disclosure. Note that, in each of the following embodiments, an organic EL display device including an organic EL element layer is exemplified as a display device including a light-emitting element layer. Here, FIG. 1 is a plan view illustrating a schematic configuration of an organic EL display device 70 according to the present embodiment. Further, FIG. 2 is a plan view of a display region D of an organic EL display panel 50*a* constituting the organic EL display device 70. Further, FIG. 3 is a cross-sectional view of the display region D of the organic EL display panel 50*a* taken along a line in FIG. 1. Further, FIG. 4 is an equivalent circuit diagram of a thin film transistor layer 30*a* constituting the organic EL display panel 50*a*. Further, FIG. 5 is a cross-sectional view of an organic EL layer 33 constituting the organic EL display panel 50*a*. Further, FIG. 6, FIG. 7, and FIG. 8 are cross-sectional views of a frame region F of the organic EL display panel 50*a* taken along a line VI-VI, a line VII-VII, and a line VIII-VIII in FIG. 1, respectively. Further, FIG. 9 is a plan view of an image capturing region Dc of the organic EL display panel 50*a*, and of the periphery of the image capturing region Dc. Further, FIG. 10 is a cross-sectional view of the image capturing region Dc of the organic EL display panel 50*a* and the periphery of the image capturing region Dc, taken along a line X-X in FIG. 9.

As illustrated in FIG. 1, the organic EL display device 70 includes, for example, the display region D provided in a rectangular shape and configured to display an image, the image capturing region Dc provided in a rectangular shape inside the display region D and configured to display and capture an image, and the frame region F provided in a frame-like rectangular shape around the display region D. Here, the organic EL display device 70 includes an organic EL display panel 50*a* described later, and an image capturing unit 60 (see FIG. 1) provided on a resin substrate layer 10 side (back face side) of the image capturing region Dc of the display region D of the organic EL display panel 50*a*. The resin substrate layer 10 will be described later. Note that in the present embodiment, the display region D having the rectangular shape is exemplified, but the rectangular shape includes a substantial rectangular shape such as a shape whose sides are arc-shaped, a shape whose corners are arc-shaped, and a shape in which a part of a side has a notch. Further, in the present embodiment, the image capturing region Dc having the rectangular shape is exemplified, but the image capturing region Dc may have another shape such as a circle, an oval, or a polygon. Further, in the present embodiment, a configuration is exemplified in which one image capturing region Dc is provided inside the display region D, but a plurality of the image capturing regions Dc may be provided inside the display region D. Further, the image capturing unit 60 is, for example, a complementary metal oxide semiconductor (CMOS) camera, a charge coupled device (CCD) camera, or the like. Further, as illustrated in FIG. 1, the image capturing region Dc is provided in an intermediate portion of a portion, along the left side of the drawing, of the display region D in a plan view.

As illustrated in FIG. 2, a plurality of subpixels P are arrayed in a matrix shape in the display region D. In addition, in the display region D, for example, a subpixel P including a red light-emitting region Lr for displaying a red color, a subpixel P including a green light-emitting region Lg for displaying a green color, and a subpixel P including a blue light-emitting region Lb for displaying a blue color are provided adjacent to one another, as illustrated in FIG. 2. Note that one pixel is configured by, for example, the three adjacent subpixels P including the red light-emitting region Er, the green light-emitting region Eg, and the blue light-emitting region Eb in the display region D. Here, as illustrated in FIG. 9, the plurality of subpixels P are divided into a group of normal subpixels Pa that are provided so as not to overlap with the image capturing unit 60, and a group of thinned-out subpixels Pb that are provided in the image capturing region Dc so as to overlap with the image capturing unit 60, and that are thinned out compared with the group of normal subpixels Pa. Note that the size of the subpixel P (the normal subpixel Pa and the thinned-out subpixel Pb) is, for example, approximately 50 μm×30 μm, and the size of the image capturing region Dc is, for example, approximately 3 mm×3 mm.

A terminal portion T is provided in an end portion of the frame region F on the right side in FIG. 1 so as to extend in one direction (the vertical direction in the drawing). Further, as illustrated in FIG. 1, in the frame region F, a bendable bending portion B that can bend, for example, by 180° (in a U-shape) with the vertical direction in the drawing as a bending axis is provided between the display region D and the terminal portion T so as to extend in one direction (the vertical direction in the drawing). Further, a plurality of terminals are arrayed in the terminal portion T along a direction in which the terminal portion T extends. Further, as illustrated in FIG. 1 and FIG. 6, in the frame region F, a first flattening film 19*a* and a second flattening film 22*a*, which will be described later, are provided with a trench G having a substantially C-like shape in a plan view passing through the first flattening film 19*a* and the second flattening film 22*a*. Here, as illustrated in FIG. 1, in a plan view, the trench G is provided in the substantially C-like shape so as to be open on the terminal portion T side.

As illustrated in FIG. 3, the organic EL display panel 50*a* includes the resin substrate layer 10 provided as a base substrate layer, a thin film transistor (hereinafter, also referred to as a TFT) layer 30*a* provided on the resin substrate layer 10, an organic EL element layer 35 provided on the TFT layer 30*a* as a light-emitting element layer, and a sealing film 40 provided on the organic EL element layer 35.

The resin substrate layer 10 is formed, for example, of an organic resin material such as a polyimide resin or the like.

As illustrated in FIG. 3, the TFT layer 30*a* includes a base coat film 11 provided on the resin substrate layer 10, and a plurality of first TFTs 9*a*, a plurality of second TFTs 9*b* (see FIG. 4), a plurality of third TFTs 9*c*, and a plurality of capacitors 9*d* provided on the base coat film 11. Further, as illustrated in FIG. 3, the TFT layer 30*a* includes the first flattening film 19*a*, an inorganic insulating film 20*a*, and the second flattening film 22*a*, which are sequentially provided on each of the first TFTs 9*a*, each of the second TFTs 9*b*, each of the third TFTs 9*c*, and each of the capacitors 9*d*.

As illustrated in FIG. 3, in the TFT layer 30*a*, semiconductor layers 12*a* and 12*b*, a gate insulating film 13, gate electrodes 14*a* and 14*b* and a lower conductive layer 14*c* (third wiring line layer), a first interlayer insulating film 15, an upper conductive layer 16*a* (fourth wiring line layer), a second interlayer insulating film 17, source electrodes 18*a* and 18*c* and drain electrodes 18*b* and 18*d* (first wiring line layer), the first flattening film 19*a*, the inorganic insulating film 20*a*, a power source line 21*a* and a relay electrode 21*b* (second wiring line layer), and the second flattening film 22*a* are sequentially layered on the base coat film 11.

As illustrated in FIG. 2 and FIG. 4, in the TFT layer 30*a*, in the display region D, a plurality of gate lines 14*d* are provided as a third wiring line layer so as to extend in parallel to each other in the lateral direction in the drawings.

Further, as illustrated in FIG. 2 and FIG. 4, in the TFT layer 30a, in the display region D, a plurality of light emission control lines 14e are provided as the third wiring line layer so as to extend in parallel to each other in the lateral direction in the drawings. Note that the gate lines 14d and the light emission control lines 14e are formed of the same material in the same layer as the gate electrodes 14a and 14b and the lower conductive layer 14c. Further, as illustrated in FIG. 2, each of the light emission control lines 14e is provided so as to be adjacent to each of the gate lines 14d. Further, as illustrated in FIG. 2 and FIG. 4, in the TFT layer 30a, in the display region D, a plurality of source lines 18f are provided as a first wiring line layer so as to extend in parallel to each other in the vertical direction in the drawings. Note that the source lines 18f are formed of the same material in the same layer as the source electrodes 18a and 18c and the drain electrodes 18b and 18d. Further, in the TFT layer 30a, in the display region D, as illustrated in FIG. 1, the power source lines 21a are provided in a lattice pattern as a fourth wiring line layer. Further, in the TFT layer 30a, as illustrated in FIG. 4, each of the subpixels P includes the first TFT 9a, the second TFT 9b, the third TFT 9c, and the capacitor 9d. Here, in the image capturing region Dc, as illustrated in FIG. 9, the gate lines 14d and the light emission control lines 14e are provided so as to be thinned out to ⅙ as a result of five lines being thinned out every six lines, and the source lines 18f are provided so as to be thinned out to ¼ as a result of three lines being thinned out every four lines. Note that, in the plan view of FIG. 9, the light emission control lines 14e are omitted.

For example, each of the base coat film 11, the gate insulating film 13, the first interlayer insulating film 15, the second interlayer insulating film 17, and the inorganic insulating film 20a is formed of a single-layer film or a layered film of silicon nitride, silicon oxide, silicon oxynitride, or the like.

As illustrated in FIG. 4, the first TFT 9a is electrically connected to the corresponding gate line 14d, the corresponding source line 18f, and the corresponding second TFT 9b in each subpixel P. Additionally, as illustrated in FIG. 3, the first TFT 9a includes a semiconductor layer 12a, a gate insulating film 13, a gate electrode 14a, a first interlayer insulating film 15, a second interlayer insulating film 17, and a source electrode 18a and a drain electrode 18b, which are sequentially provided on the base coat film 11. Here, as illustrated in FIG. 3, the semiconductor layer 12a is provided on the base coat film 11, and includes a channel region, a source region, and a drain region, as described below. Further, the semiconductor layer 12a and a semiconductor layer 12b described later are formed of, for example, a low-temperature polysilicon film, an In—Ga—Zn—O-based oxide semiconductor film, or the like. Additionally, as illustrated in FIG. 3, the gate insulating film 13 is provided so as to cover the semiconductor layer 12a. Additionally, as illustrated in FIG. 3, the gate electrode 14a is provided on the gate insulating film 13 so as to overlap with the channel region of the semiconductor layer 12a. Additionally, as illustrated in FIG. 3, the first interlayer insulating film 15 and the second interlayer insulating film 17 are sequentially provided so as to cover the gate electrode 14a. Further, as illustrated in FIG. 3, the source electrode 18a and the drain electrode 18b are provided on the second interlayer insulating film 17 as terminal electrodes while being separated from each other. Additionally, as illustrated in FIG. 3, the source electrode 18a and the drain electrode 18b are electrically connected to the source region and the drain region of the semiconductor layer 12a, respectively, via each contact hole formed in a layered film including the gate insulating film 13, the first interlayer insulating film 15, and the second interlayer insulating film 17.

As illustrated in FIG. 4, the second TFT 9b is electrically connected to the corresponding first TFT 9a, the corresponding power source line 21a, and the corresponding third TFT 9c in each subpixel P. Note that the second TFT 9b has substantially the same structure as the first TFT 9a and the third TFT 9c to be described later.

As illustrated in FIG. 4, the third TFT 9c is electrically connected to the corresponding second TFT 9a, the corresponding power source line 21a, and the corresponding light emission control line 14e in each subpixel P. Additionally, as illustrated in FIG. 3, the third TFT 9c includes a semiconductor layer 12b, the gate insulating film 13, a gate electrode 14b, the first interlayer insulating film 15, the second interlayer insulating film 17, and a source electrode 18c and a drain electrode 18d, which are sequentially provided on the base coat film 11. Here, as illustrated in FIG. 3, the semiconductor layer 12b is provided on the base coat film 11, and includes a channel region, a source region, and a drain region, similarly to the semiconductor layer 12a. Additionally, as illustrated in FIG. 3, the gate insulating film 13 is provided so as to cover the semiconductor layer 12b. Additionally, as illustrated in FIG. 3, the gate electrode 14b is provided on the gate insulating film 13 so as to overlap with the channel region of the semiconductor layer 12b. Additionally, as illustrated in FIG. 3, the first interlayer insulating film 15 and the second interlayer insulating film 17 are sequentially provided so as to cover the gate electrode 14b. Further, as illustrated in FIG. 3, the source electrode 18c and the drain electrode 18d are provided on the second interlayer insulating film 17 as terminal electrodes while being separated from each other. Additionally, as illustrated in FIG. 3, the source electrode 18c and the drain electrode 18d are electrically connected to the source region and the drain region of the semiconductor layer 12b, respectively, via each contact hole formed in a layered film including the gate insulating film 13, the first interlayer insulating film 15, and the second interlayer insulating film 17. Further, as illustrated in FIG. 3, the drain electrode 18d is electrically connected to the relay electrode 21b via a contact hole formed in the first flattening film 19a and the inorganic insulating film 20a.

Note that, in the present embodiment, the first TFT 9a, the second TFT 9b, and the third TFT 9c of a top gate type are exemplified, but the first TFT 9a, the second TFT 9b, and the third TFT 9c may be of a bottom gate type.

As illustrated in FIG. 4, the capacitor 9d is electrically connected to the corresponding first TFT 9a and the corresponding power source line 21a in each subpixel P. Here, as illustrated in FIG. 3, the capacitor 9d includes the lower conductive layer 14c provided as the first wiring line layer, the first interlayer insulating film 15 provided so as to cover the lower conductive layer 14c, and the upper conductive layer 16a provided, as a second wiring line layer, on the first interlayer insulating film 15 so as to overlap with the lower conductive layer 14c. Note that the upper conductive layer 16a is electrically connected to the power source line 21a via a contact hole (not illustrated) formed in the second interlayer insulating film 17, the first flattening film 19a, and the inorganic insulating film 20a.

Each of the first flattening film 19a, the second flattening film 22a, and an edge cover 32a described later is formed of, for example, an organic resin material such as a polyimide resin, an acrylic resin, and a novolac resin.

The inorganic insulating film 20a is provided so as to suppress contamination in a chamber of a dry etching device as a result of a surface of the first flattening film 19a being etched when patterning is performed on the second wiring line layer, such as the power source line 21a, by dry etching. Then, as illustrated in FIG. 9 and FIG. 10, in the inorganic insulating film 20a, in the image capturing region Dc overlapping with the group of thinned-out subpixels Pb, first openings Maa and second openings Mab each having a dot-like shape are provided so as to pass through the inorganic insulating film 20a. Here, as illustrated in FIG. 9, the first openings Maa are provided along the boundary between the group of normal subpixels Pa and the group of thinned-out subpixels Pb. Note that, since a center-to-center distance N (see FIG. 10) in a plan view between the first opening Maa and a contact hole H of the normal subpixel Pa closest to the first opening Maa is, for example, from 15 μm to 50 μm, moisture in the first flattening film 19a can be easily released from the first opening Maa. Further, as illustrated in FIG. 9, the second openings Mab are provided around each of the thinned-out subpixels Pb. Note that, since a center-to-center distance in a plan view between the second opening Mab and a contact hole of the thinned-out subpixel Pb located at the center and corresponding to the second opening Mab is from 15 μm to 50 μm, the moisture in the first flattening film 19a can be easily released from the second opening Mab.

As illustrated in FIG. 3 and FIG. 10, the relay electrode 21b is provided, as the second wiring line layer, on the inorganic insulating film 20a, and is formed of the same material in the same layer as the power source line 21a.

As illustrated in FIG. 3, the organic EL element layer 35 includes a plurality of first electrodes 31a, the edge cover 32a, a plurality of organic EL layers 33, and a second electrode 34, which are sequentially layered on the TFT layer 30a.

As illustrated in FIG. 3, the plurality of first electrodes 31a are provided in a matrix shape on the second flattening film 22a so as to correspond to the plurality of subpixels P. Here, as illustrated in FIG. 3, the first electrode 31a is electrically connected to the drain electrode 18d of each of the third TFTs 9c via the contact hole H (see FIG. 10) formed in the first flattening film 19a and the inorganic insulating film 20a, the relay electrode 21b, and a contact hole formed in the second flattening film 22a. Additionally, the first electrode 31a has a function to inject a hole (positive hole) into each of the organic EL layers 33. Additionally, the first electrode 31a is preferably formed of a material having a high work function to improve hole injection efficiency into the organic EL layer 33. Here, examples of a material constituting the first electrode 31a include a metal material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), tin (Sn) and the like. Examples of the material of the first electrode 31a also include an alloy such as astatine (At)/astatine oxide (AtO$_2$). Further, the material constituting the first electrode 31a may be, for example, an electrically conductive oxide such as tin oxide (SnO), zinc oxide (ZnO), indium tin oxide (ITO), indium zinc oxide (IZO) and the like. Additionally, the first electrode 31a may be formed by layering a plurality of layers including any of the materials described above. Note that examples of compound materials having a high work function include indium tin oxide (ITO) and indium zinc oxide (IZO).

As illustrated in FIG. 3, the edge cover 32a is common to the plurality of subpixels P, and is provided in a lattice pattern so as to cover a peripheral end portion of each of the first electrodes 31a.

As illustrated in FIG. 3, the plurality of organic EL layers 33 are disposed on the plurality of first electrodes 31a, and are provided, as light-emitting function layers, in a matrix shape so as to correspond to the plurality of subpixels P. Here, as illustrated in FIG. 5, each of the organic EL layers 33 includes a hole injection layer 1, a hole transport layer 2, a light-emitting layer 3, an electron transport layer 4, and an electron injection layer 5, which are sequentially provided on the first electrode 31a.

The hole injection layer 1 is also referred to as an anode buffer layer, has a function of bringing energy levels of the first electrode 31a and the organic EL layer 33 close to each other to improve hole injection efficiency from the first electrode 31a into the organic EL layer 33, and is provided as a common light-emitting function layer that is common to the plurality of subpixels P. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 has a function of improving hole transport efficiency from the first electrode 31a to the organic EL layer 33, and is provided as a common light-emitting function layer that is common to the plurality of subpixels P. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is provided as an individual light-emitting function layer of each of the subpixels P, and is a region in which holes and electrons are injected from the first electrode 31a and the second electrode 34, and holes and electrons recombine together when a voltage is applied by the first electrode 31a and the second electrode 34. Here, the light-emitting layer 3 is formed of a material having high luminous efficiency. Moreover, examples of materials constituting the light-emitting layer 3 include metal oxinoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, tristyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane, and the like.

The electron transport layer 4 has a function of efficiently moving electrons to the light-emitting layer 3, and is provided as a common light-emitting function layer that is common to the plurality of subpixels P. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds, as organic compounds.

The electron injection layer 5 has a function to bring energy levels of the second electrode 34 and the organic EL layer 33 close to each other in order to improve the efficiency of electron injection into the organic EL layer 33 from the second electrode 34, and using this function, the drive voltage of each organic EL element constituting the organic EL element layer 35 can be reduced. Note that the electron injection layer 5 is also referred to as a cathode buffer layer, and is provided as a common light-emitting function layer that is common to the plurality of subpixels P. Here, examples of materials constituting the electron injection layer 5 include inorganic alkaline compounds, such as lithium fluoride (LiF), magnesium fluoride (MgF$_2$), calcium fluoride (CaF$_2$), strontium fluoride (SrF$_2$), and barium fluoride (BaF$_2$), aluminum oxide (Al$_2$O$_3$), and strontium oxide (SrO).

As illustrated in FIG. 3, the second electrode 34 is common to the plurality of subpixels P, and is provided so as to cover each of the organic EL layers 33 and the edge cover 32*a*. Further, the second electrode 34 functions to inject electrons into the organic EL layer 33. Further, the second electrode 34 is preferably formed of a material having a low work function to improve the efficiency of electron injection into the organic EL layer 33. Here, examples of a material constituting the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). Further, the second electrode 34 may be formed of alloy such as magnesium (Mg)/copper (Cu), magnesium (Mg)/silver (Ag), sodium (Na)/potassium (K), astatine (At)/astatine oxide (AtO$_2$), lithium (Li)/aluminum (Al), lithium (Li)/calcium (Ca)/aluminum (Al), and lithium fluoride (LiF)/calcium (Ca)/aluminum (Al). Further, the second electrode 34 may be formed of an electrically conductive oxide such as tin oxide (SnO), zinc oxide (ZnO), indium tin oxide (ITO), and indium zinc oxide (IZO). Further, the second electrode 34 may be formed by layering a plurality of layers formed of any of the materials described above. Note that examples of materials having a low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 3, FIG. 6, FIG. 7, and FIG. 10, the sealing film 40 is provided so as to cover the second electrode 34, includes a first inorganic sealing film 36, an organic sealing film 37, and a second inorganic sealing film 38 that are sequentially layered on the second electrode 34, and has a function of protecting each of the organic EL layers 33 of the organic EL element layer 35 from moisture and oxygen. Here, each of the first inorganic sealing film 36 and the second inorganic sealing film 38 is made of, for example, an inorganic insulating film such as a silicon nitride film, a silicon oxide film, a silicon oxynitride film or the like. Additionally, the organic sealing film 37 is made of, for example, an organic resin material such as an acrylic resin, an epoxy resin, a silicone resin, a polyurea resin, a parylene resin, a polyimide resin, a polyamide resin or the like.

Further, as illustrated in FIG. 1, the organic EL display panel 50*a* includes, in the frame region F, a first outer dam wall Wa provided in a rectangular frame-like shape outside the trench G so as to surround the display region D, and a second outer dam wall Wb provided in a rectangular frame-like shape around the first outer dam wall Wa.

As illustrated in FIG. 6 and FIG. 7, the first outer dam wall Wa includes a lower resin layer 22*b* formed of the same material in the same layer as the second flattening film 22*a*, and an upper resin layer 32*b* formed of the same material in the same layer as the edge cover 32*a*. Note that, as illustrated in FIG. 6 and FIG. 7, the first outer dam wall Wa is provided so as to overlap with an outer peripheral end portion of the organic sealing film 37 of the sealing film 40, and is configured to suppress the spread of ink that forms the organic sealing film 37 of the sealing film 40.

As illustrated in FIG. 6 and FIG. 7, the second outer dam wall Wb includes a lower resin layer 19*b* formed of the same material in the same layer as the first flattening film 19*a*, an intermediate resin layer 22*c* formed of the same material in the same layer as the second flattening film 22*a*, and an upper resin layer 32*c* formed of the same material in the same layer as the edge cover 32*a*.

Further, as illustrated in FIG. 1, the organic EL display panel 50*a* includes, in the frame region F, a first frame wiring line 18*h* provided as the first wiring line layer. The first frame wiring line 18*h* extends in a wide belt-like shape in an open portion of the trench G, a portion thereof, on the display region D side, extends linearly to the inner side of the trench G, and both end portions thereof, on the opposite side from the display region D, extend to the terminal portion T. Here, the first frame wiring line 18*h* is electrically connected to the power source line 21*a* on the display region D side of the frame region F, and is configured so that a high power supply voltage (ELVDD) is input at the terminal portion T. Further, as illustrated in FIG. 6 and FIG. 7, the first frame wiring line 18*h* and a second frame wiring line 18*i* described later are formed of the same material in the same layer as the source electrodes 18*a* and 18*c* and the drain electrodes 18*b* and 18*d*, and each includes a first metal layer 6, a second metal layer 7, and a third metal layer 8 that are sequentially layered from the resin substrate layer 10 side toward the organic EL element layer 35 side. Here, the first metal layer 6 and the third metal layer 8 are each formed of, for example, a titanium film having a thickness of approximately 100 nm to 200 nm, and the second metal layer 7 is formed of, for example, an aluminum film having a thickness of approximately 100 nm to 1000 nm. Note that since the above-described source electrodes 18*a* and 18*c*, the above-described drain electrodes 18*b* and 18*d*, the above-described source line 18*f*, and a lead-out wiring line 18*j* described later form the third wiring line layer, similarly to the first frame wiring line 18*h* and the second frame wiring line 18*i*, they also include the first metal layer 6, the second metal layer 7, and the third metal layer 8 that are sequentially layered from the resin substrate layer 10 side toward the organic EL element layer 35 side (not illustrated).

Further, as illustrated in FIG. 1, the organic EL display panel 50*a* includes, in the frame region F, the second frame wiring line 18*i* provided in a substantially C-like shape as the first wiring line layer outside the trench G, with both end portions thereof extending to the terminal portion T. Here, as illustrated in FIG. 6, the second frame wiring line 18*i* is electrically connected to the second electrode 34 via a first conductive layer 31*b* formed in the trench G, and is configured so that a low power supply voltage (ELVSS) is input at the terminal portion T. Note that, as illustrated in FIG. 6, the first conductive layer 31*b* is formed of the same material in the same layer as the first electrode 31*a*, overlaps with the second frame wiring line 18*i* and the second electrode 34 in the frame region F, and electrically connects the second frame wiring line 18*i* and the second electrode 34 to each other.

Further, as illustrated in FIG. 8, the organic EL display panel 50*a* includes, in the bending portion B of the frame region F, a filler resin layer 25 provided to fill a slit S formed in the base coat film 11, the gate insulating film 13, the first interlayer insulating film 15, and the second interlayer insulating film 17, a plurality of lead-out wiring lines 18*j* provided on the filler resin layer 25 and the second interlayer insulating film 17, and a coating resin layer 19*c* provided so as to cover the lead-out wiring lines 18*j*. Note that, as illustrated in FIG. 8, the slit S is provided in a groove-like shape extending along a direction in which the bending portion B extends so as to pass through the base coat film 11, the gate insulating film 13, the first interlayer insulating film 15, and the second interlayer insulating film 17, thereby exposing the surface of the resin substrate layer 10. Further, the filler resin layer 25 is formed of, for example, an organic resin material such as a polyimide resin. Further, the plurality of lead-out wiring lines 18*j* are provided so as to extend in parallel to each other in a direction orthogonal to the direction in which the bending portion B extends. Here, as illustrated in FIG. 8, both end portions of each of the lead-out wiring lines 18*j* are electrically connected to a first gate conductive layer 14*f* and a second gate conductive layer 14*g* via each contact hole formed in a layered film including the first interlayer insulating film 15 and the second interlayer insulating film 17. Note that, as described above, the lead-out wiring line 18*j* is provided as the first wiring line layer, and is formed of the same material in the same layer as the source electrodes 18*a* and 18*c* and the drain electrodes 18*b* and 18*d*. Further, as illustrated in FIG. 8, the first gate conductive layer 14*f* is provided between the gate insulating film 13 and the first interlayer insulating film 15, and is electrically connected to signal wiring lines (the source line 18*f*, the gate line 14*d*, and the like) extending to the display region D. Further, as illustrated in FIG. 8, the second gate conductive layer 14*g* is provided between the gate insulating film 13 and the first interlayer insulating film 15, and is electrically connected, for example, to a terminal of the terminal portion T. Further, the coating resin layer 19*c* is formed of the same material in the same layer as the first flattening film 19*a*.

In the organic EL display device 70 described above, in each of the subpixels P, by inputting a gate signal to the first TFT 9*a* via the gate line 14*d*, the first TFT 9*a* is turned on. When a predetermined voltage corresponding to a source signal is written to the gate electrode 14*b* of the second TFT 9*b* and the capacitor 9*d* via the source line 18*f*, and a light emission control signal is input to the third TFT 9*c* via the light emission control line 14*e*, the third TFT 9*c* is turned on. Then, by supplying a current corresponding to the gate voltage of the second TFT 9*b* from the power source line 21*a* to the organic EL layer 33, the light-emitting layer 3 of the organic EL layer 33 emits light to display an image. Note that, in the organic EL display device 70, even when the first TFT 9*a* is turned off, the gate voltage of the second TFT 9*b* is held by the capacitor 9*d*, and thus, light emission by the light-emitting layer 3 is maintained in each of the subpixels P until a gate signal of the next frame is input. Further, the organic EL display device 70 is configured to capture an image on the front face side of the organic EL display panel 50*a* through the organic EL display panel 50*a*, using the image capturing unit 60 installed on the back face side of the organic EL display panel 50*a*.

Next, a manufacturing method of the organic EL display device 70 according to the present embodiment will be described. Here, the manufacturing method of the organic EL display device 70 according to the present embodiment includes a TFT layer forming step, an organic EL element layer forming step, and a sealing film forming step.

TFT Layer Forming Step

First, for example, a non-photosensitive polyimide resin (having a thickness of approximately 6 μm) is applied onto a glass substrate, and then the applied film is prebaked and postbaked to form the resin substrate layer 10.

Subsequently, a silicon oxide film (having a thickness of approximately 500 nm) and a silicon nitride film (having a thickness of approximately 100 nm) are sequentially formed, for example, by a plasma chemical vapor deposition (CVD) method, on the substrate surface on which the resin substrate layer 10 is formed, to form the base coat film 11.

Thereafter, for example, an amorphous silicon film (having a thickness of approximately 30 nm to 100 nm) is formed, by the plasma CVD method, on the substrate surface on which the base coat film 11 is formed, the amorphous silicon film is crystallized by laser annealing or the like to form a semiconductor film of a polysilicon film, and then, the semiconductor film is patterned to form the semiconductor layers 12*a* and 12*b*, and the like.

Furthermore, an inorganic insulating film (of approximately 100 nm) such as a silicon oxide film is formed, for example, by a plasma CVD method, on the substrate surface on which the semiconductor layer 12*a* and the like are formed, to form the gate insulating film 13 to cover the semiconductor layer 12*a* and the like.

Subsequently, a molybdenum film (having a thickness of approximately 100 nm to 400 nm) is formed, for example, by a sputtering method, on the substrate surface on which the gate insulating film 13 is formed, and then, the molybdenum film is patterned to form the third wiring line layer including the gate electrodes 14*a* and 14*b* and the like.

Thereafter, by doping impurity ions using the gate electrodes 14*a* and 14*b* as a mask, a portion of each of the semiconductor layers 12*a* and 12*b* is made conductive.

Furthermore, a silicon nitride film (having a thickness of approximately 50 nm to 200 nm) is formed, for example, by a plasma CVD method, on the substrate surface on which a portion of the semiconductor layer 12*a* and the like has been made conductive, to form the first interlayer insulating film 15.

Subsequently, a molybdenum film (having a thickness of approximately 100 nm to 400 nm) is formed, for example, by a sputtering method, on the substrate surface on which the first interlayer insulating film 15 is formed, and then, the molybdenum film is patterned to form the fourth wiring line layer including the upper conductive layer 16*a* and the like.

Thereafter, a silicon oxide film (having a thickness of approximately 100 nm to 500 nm) and a silicon nitride film (having a thickness of approximately 100 nm to 300 nm) are sequentially formed, for example, by a plasma CVD method, on the substrate surface on which the above-described fourth wiring line layer is formed, to form the second interlayer insulating film 17.

Furthermore, the gate insulating film 13, the first interlayer insulating film 15, and the second interlayer insulating film 17 are patterned to form a contact hole.

Subsequently, a titanium film (having a thickness of approximately 50 nm), an aluminum film (having a thickness of approximately 600 nm), and a titanium film (having a thickness of approximately 50 nm) are sequentially formed, for example, by a sputtering method, on the substrate surface in which the above-described contact hole is formed, and then, a metal layered film thereof is patterned to form the first wiring line layer including the source electrodes 18a and 18c, the drain electrodes 18b and 18d, and the like.

Thereafter, a photosensitive polyimide resin (having a thickness of approximately 2.5 μm) is applied, for example, by a spin coating method or a slit coating method, onto the substrate surface on which the above-described first wiring line layer is formed, and then, the applied film is prebaked, exposed, developed, and postbaked to form the first flattening film 19a.

Furthermore, a silicon nitride film (having a thickness of approximately 100 nm to 500 nm) is sequentially formed, for example, by a plasma CVD method, on the substrate surface on which the first flattening film 19a is formed, and then, the silicon nitride film is patterned to form the inorganic insulating film 20a provided with an upper portion of the contact hole H, the first openings Maa, and the second openings Mab.

Then, a titanium film (having a thickness of approximately 50 nm), an aluminum film (having a thickness of approximately 600 nm), and a titanium film (having a thickness of approximately 50 nm) are sequentially formed, for example, by a sputtering method, on the substrate surface on which the inorganic insulating film 20a is formed, and then, a metal layered film thereof is patterned to form the second wiring line layer including the power source line 21a, the relay electrode 21b, and the like.

Finally, a photosensitive polyimide resin (having a thickness of approximately 2.5 μm) is applied, for example, by a spin coating method or a slit coating method, onto the substrate surface on which the above-described second wiring line layer is formed, and then, the applied film is prebaked, exposed, developed, and postbaked to form the second flattening film 22a.

As described above, the TFT layer 30a can be formed.

Organic EL Element Layer Forming Step

On the second flattening film 22a of the TFT layer 30a formed in the TFT layer forming step described above, the first electrode 31a, the edge cover 32a, the organic EL layer 33 (the hole injection layer 1, the hole transport layer 2, the light-emitting layer 3, the electron transport layer 4, and the electron injection layer 5), and the second electrode 34 are formed using a known method to form the organic EL element layer 35.

Sealing Film Forming Step

First, an inorganic insulating film such as a silicon nitride film, a silicon oxide film, or a silicon oxynitride film is formed by the plasma CVD method using a mask, on the substrate surface on which the organic EL element layer 35 is formed at the above-described organic EL element layer forming step, to form the first inorganic sealing film 36.

Subsequently, on the substrate surface on which the first inorganic sealing film 36 is formed, a film made of an organic resin material such as acrylic resin is formed, for example, by an ink-jet method, to form the organic sealing film 37.

Thereafter, an inorganic insulating film such as a silicon nitride film, a silicon oxide film, or a silicon oxynitride film is formed by the plasma CVD method using a mask, on the substrate on which the organic sealing film 37 is formed, to form the second inorganic sealing film 38, thereby forming the sealing film 40.

The organic EL display panel 50a of the present embodiment can be manufactured as described above.

Furthermore, when the manufactured organic EL display panel 50a is fixed, for example, to the interior of a housing, the organic EL display device 70 can be manufactured by installing the image capturing unit 60 on the back face side of the image capturing region Dc of the organic EL display panel 50a.

As described above, according to the organic EL display device 70 of the present embodiment, in the inorganic insulating film 20a on the first flattening film 19a, the first openings Maa and the second openings Mab are provided so as to pass through the inorganic insulating film 20a in the image capturing region Dc overlapping with the group of thinned-out subpixels Pb. Here, since the first openings Maa are provided along the boundary between the group of normal subpixels Pa and the group of thinned-out subpixels Pb, in the subpixel Pa adjacent to the thinned-out subpixel Pb, moisture in the first flattening film 19a can be released from the first openings Maa. Accordingly, in the subpixel Pa adjacent to the thinned-out subpixel Pb, oxidation of the relay electrode 21b can be suppressed. As a result, the electrical connection between the relay electrode 21b and the first electrode 31a is improved, and the lighting failure can be suppressed. Further, since the second openings Mab are provided around each of the thinned-out subpixels Pb, in the thinned-out subpixel Pb, moisture in the first flattening film 19a can be released from the second opening Mab. Accordingly, in the thinned-out subpixel Pb, oxidation of the relay electrode 21b can be suppressed. As a result, the electrical connection between the relay electrode 21b and the first electrode 31a is improved, and the lighting failure can be suppressed. Therefore, it is possible to suppress the occurrence of the lighting failure in the thinned-out subpixel Pb and the subpixel Pa adjacent to the thinned-out subpixel Pb.

Further, according to the organic EL display device 70 of the present embodiment, since the inorganic insulating film 20a is provided on the first flattening film 19a, when the second wiring line layer such as the power source line 21a is patterned by dry etching, etching of the surface of the first flattening film 19a is suppressed, and thus, the contamination in the chamber of the dry etching device can be suppressed.

Second Embodiment

Figure 11:
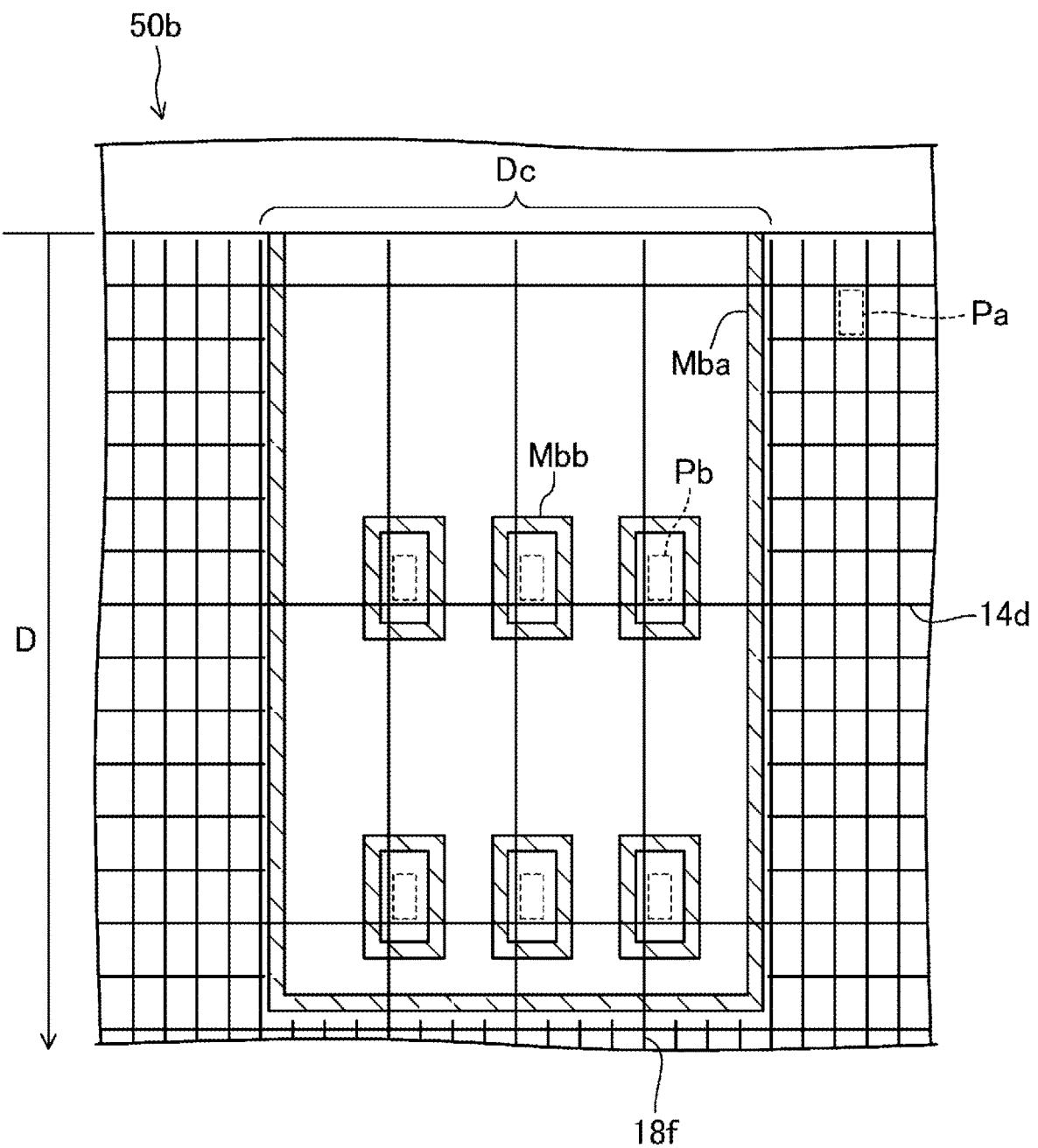
FIG. 11 is a plan view of an image capturing region of an organic EL display panel constituting an organic EL display device according to a second embodiment of the disclosure, and of the periphery of the image capturing region.

FIG. 11 illustrates a second embodiment of a display device according to the disclosure. Here, FIG. 11 is a plan view of the image capturing region Dc of an organic EL display panel 50b constituting an organic EL display device of the present embodiment, and of the periphery of the image capturing region Dc. Note that, in the following embodiments, portions identical to those in FIG. 1 to FIG. 10 are denoted by the same reference signs, and their detailed descriptions are omitted.

In the first embodiment, the organic EL display device 70 is exemplified that includes the organic EL display panel 50a in which the first openings Maa and the second openings Mab each having the dot-like shape are provided in the inorganic insulating film 20a, but in the present embodiment, an organic EL display device is exemplified that includes the organic EL display panel 50b in which a first opening Mba and second openings Mbb each having a belt-like shape are provided in the inorganic insulating film 20*a*.

Similarly to the organic EL display device 70 of the first embodiment described above, the organic EL display device of the present embodiment includes the display region D provided in the rectangular shape and configured to display an image, the image capturing region Dc provided in the rectangular shape inside the display region D and configured to display and capture an image, and the frame region F provided in the frame-like rectangular shape around the display region D. Further, the organic EL display device of the present embodiment includes the organic EL display panel 50*b* described later, and the image capturing unit 60 provided on the resin substrate layer 10 side (back face side) of the image capturing region Dc of the organic EL display panel 50*b*.

In the organic EL display panel 50*b*, as illustrated in FIG. 11, in the inorganic insulating film 20*a*, the first opening Mba and the second openings Mbb each having the belt-like shape are provided so as to pass through the inorganic insulating film 20*a* in the image capturing region Dc overlapping with the group of thinned-out subpixels Pb. Here, as illustrated in FIG. 11, the first opening Mba is provided in a U-shape along the boundary between the group of normal subpixels Pa and the group of thinned-out subpixels Pb. Further, as illustrated in FIG. 11, the second opening Mbb is provided in a frame-like shape around each of the thinned-out subpixels Pb. Note that the rest of the configuration of the organic EL display panel 50*b* is substantially the same as that of the organic EL display panel 50*a* of the first embodiment described above.

Similarly to the organic EL display device 70 of the first embodiment described above, the organic EL display device including the organic EL display panel 50*b* has flexibility, and is configured to display an image by causing the light-emitting layer 3 of the organic EL layer 33 to emit light as appropriate via the first TFT 9*a*, the second TFT 9*b*, and the third TFT 9*c* in each of the subpixels P. Further, the organic EL display device including the organic EL display panel 50*b* is configured to capture an image on the front face side of the organic EL display panel 50*b* through the organic EL display panel 50*b*, using the image capturing unit 60 installed on the back face side of the organic EL display panel 50*b*.

The organic EL display device including the organic EL display panel 50*b* of the present embodiment can be manufactured by changing a pattern shape of the inorganic insulating film 20*a* in the manufacturing method of the organic EL display device 70 of the first embodiment described above.

As described above, according to the organic EL display device of the present embodiment, in the inorganic insulating film 20*a* on the first flattening film 19*a*, the first opening Mba and the second openings Mbb are provided so as to pass through the inorganic insulating film 20*a* in the image capturing region Dc overlapping with the group of thinned-out subpixels Pb. Here, since the first opening Mba is provided in the U-shape along the boundary between the group of normal subpixels Pa and the group of thinned-out subpixels Pb, in the subpixel Pa adjacent to the thinned-out subpixel Pb, the moisture in the first flattening film 19*a* can be released from the first opening Maa to a greater extent. Accordingly, in the subpixel Pa adjacent to the thinned-out subpixel Pb, the oxidation of the relay electrode 21*b* can be suppressed to a greater extent. As a result, the electrical connection between the relay electrode 21*b* and the first electrode 31*a* is improved, and the lighting failure can be suppressed to a greater extent. Further, since the second opening Mbb is provided in the frame-like shape around each of the thinned-out subpixels Pb, in the thinned-out subpixel Pb, the moisture in the first flattening film 19*a* can be released from the second opening Mbb to a greater extent. Accordingly, in the thinned-out subpixel Pb, the oxidation of the relay electrode 21*b* can be suppressed to a greater extent. As a result, the electrical connection between the relay electrode 21*b* and the first electrode 31*a* is improved, and the lighting failure can be suppressed to a greater extent. Therefore, it is possible to suppress the occurrence of the lighting failure in the thinned-out subpixel Pb and the subpixel Pa adjacent to the thinned-out subpixel Pb to a greater extent.

Further, according to the organic EL display device of the present embodiment, since the inorganic insulating film 20*a* is provided on the first flattening film 19*a*, when the second wiring line layer such as the power source line 21*a* is patterned by dry etching, the etching of the surface of the first flattening film 19*a* is suppressed, and thus, the contamination in the chamber of the dry etching device can be suppressed.

Third Embodiment

Figure 12:
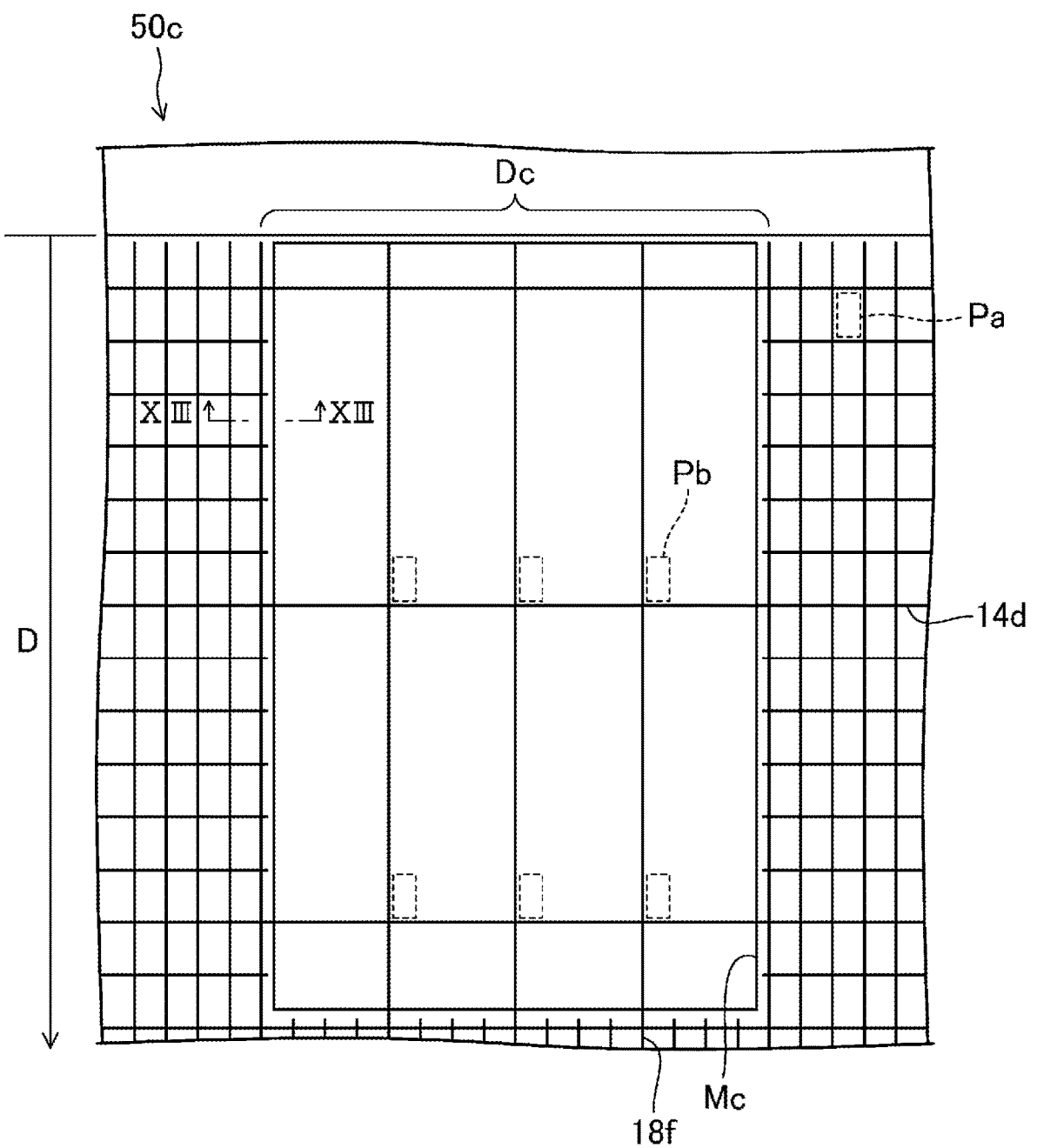
FIG. 12 is a plan view of an image capturing region of an organic EL display panel constituting an organic EL display device according to a third embodiment of the disclosure, and of the periphery of the image capturing region.
Figure 13:
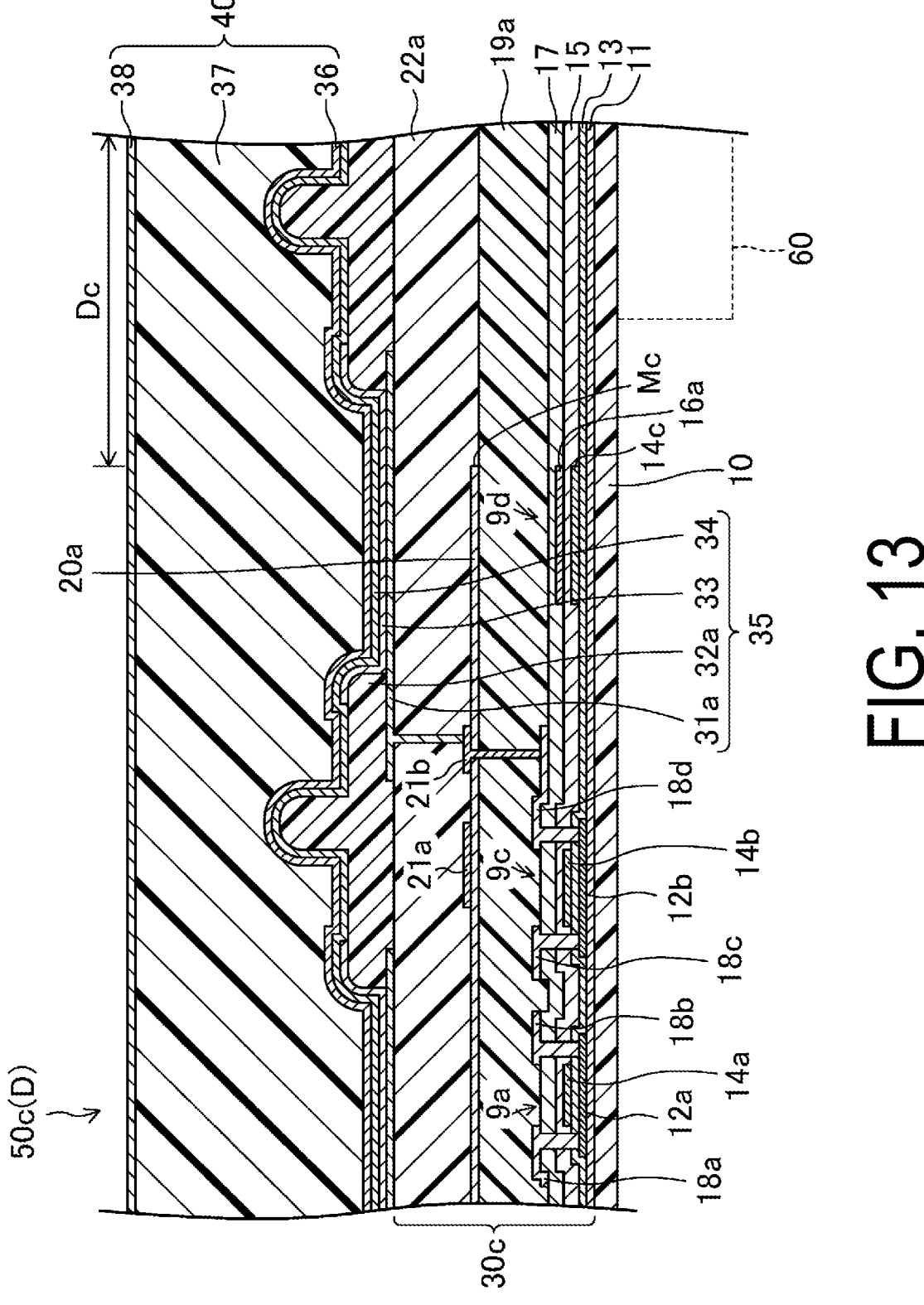
FIG. 13 is a cross-sectional view of the image capturing region of the organic EL display panel and the periphery of the image capturing region, taken along a line XIII-XIII in FIG. 12.

FIG. 12 and FIG. 13 illustrate a third embodiment of a display device according the disclosure. Here, FIG. 12 is a plan view of the image capturing region Dc of an organic EL display panel 50*c* constituting an organic EL display device of the present embodiment, and of the periphery of the image capturing region Dc. Further, FIG. 13 is a cross-sectional view of the image capturing region Dc of the organic EL display panel 50*c* and the periphery of the image capturing region Dc, taken along a line XIII-XIII in FIG. 12.

In the first and second embodiments described above, the organic EL display devices are exemplified that include the organic EL display panels 50*a* and 50*b*, respectively, in which the plurality of openings are provided in the inorganic insulating film 20*a*, but in the present embodiment, an organic EL display device is exemplified that includes the organic EL display panel 50*c* in which a single opening Mc is provided in the inorganic insulating film 20*a*.

Similarly to the organic EL display device 70 of the first embodiment described above, the organic EL display device of the present embodiment includes the display region D provided in the rectangular shape and configured to display an image, the image capturing region Dc provided in the rectangular shape inside the display region D and configured to display and capture an image, and the frame region F provided in the frame-like rectangular shape around the display region D. Further, the organic EL display device of the present embodiment includes the organic EL display panel 50*c* described later, and the image capturing unit 60 provided on the resin substrate layer 10 side (back face side) of the image capturing region Dc of the organic EL display panel 50*c*.

As illustrated in FIG. 13, the organic EL display panel 50*c* includes the resin substrate layer 10, a TFT layer 30*c* provided on the resin substrate layer 10, the organic EL element layer 35 provided on the TFT layer 30*c*, and the sealing film 40 provided on the organic EL element layer 35.

Similarly to the TFT layer 30*a* of the first embodiment described above, as illustrated in FIG. 13, the TFT layer 30*c* includes the base coat film 11 provided on the resin substrate layer 10, and the plurality of first TFTs 9*a*, the plurality of second TFTs 9*b* (see FIG. 4), the plurality of third TFTs 9*c*, and the plurality of capacitors 9*d* provided on the base coat film 11. Further, similarly to the TFT layer 30a of the first embodiment described above, as illustrated in FIG. 13, the TFT layer 30c includes the first flattening film 19a, the inorganic insulating film 20a, and the second flattening film 22a, which are sequentially provided on each of the first TFTs 9a, each of the second TFTs 9b, each of the third TFTs 9c, and each of the capacitors 9d. Further, similarly to the TFT layer 30a of the first embodiment described above, as illustrated in FIG. 13, in the TFT layer 30c, the semiconductor layers 12a and 12b, the gate insulating film 13, the gate electrodes 14a and 14b and the lower conductive layer 14c (third wiring line layer), the first interlayer insulating film 15, the upper conductive layer 16a (fourth wiring line layer), the second interlayer insulating film 17, the source electrodes 18a and 18c and the drain electrodes 18b and 18d (first wiring line layer), the first flattening film 19a, the inorganic insulating film 20a, the power source line 21a and the relay electrode 21b (second wiring line layer), and the second flattening film 22a are sequentially layered on the base coat film 11. Further, similarly to the TFT layer 30a of the first embodiment described above, in the TFT layer 30c, the plurality of gate lines 14d, the plurality of light emission control lines 14e, the plurality of source lines 18f, and the power source lines 21a are provided in the display region D. Further, similarly to the TFT layer 30a of the first embodiment described above, in the TFT layer 30c, each of the subpixels P includes the first TFT 9a, the second TFT 9b, the third TFT 9c, and the capacitor 9d. Here, in the image capturing region Dc, as illustrated in FIG. 12, the gate lines 14d and the light emission control lines 14e are provided so as to be thinned out to ⅙ as a result of five lines being thinned out every six lines, and the source lines 18f are provided so as to be thinned out to ¼ as a result of three lines being thinned out every four lines. Note that, in the plan view of FIG. 12, the light emission control lines 14e are omitted.

In the TFT layer 30c (organic EL display panel 50c), as illustrated in FIG. 12, one opening Mc is integrally provided in the inorganic insulating film 20a so as to pass through the inorganic insulating film 20a in the image capturing region Dc overlapping with the group of thinned-out subpixels Pb. Here, as illustrated in FIG. 12, the opening Mc is provided such that the outline thereof is formed in a rectangular shape, and the inorganic insulating film 20a having an island-like shape is present in a layer below the relay electrode 21b of each thinned-out subpixel Pb provided inside the opening Mc. Note that the rest of the configuration of the TFT layer 30c (organic EL display panel 50c) is substantially the same as that of the TFT layer 30a (organic EL display panel 50a) of the first embodiment.

Similarly to the organic EL display device 70 of the first embodiment described above, the organic EL display device including the organic EL display panel 50c has flexibility, and is configured to display an image by causing the light-emitting layer 3 of the organic EL layer 33 to emit light as appropriate via the first TFT 9a, the second TFT 9b, and the third TFT 9c in each of the subpixels P. Further, the organic EL display device including the organic EL display panel 50c is configured to capture an image on the front face side of the organic EL display panel 50c through the organic EL display panel 50c, using the image capturing unit 60 installed on the back face side of the organic EL display panel 50c.

The organic EL display device including the organic EL display panel 50c of the present embodiment can be manufactured by patterning the inorganic insulating film 20a excluding the first openings Maa and the second openings Mab, and then, after forming the second wiring line layer, patterning the inorganic insulating film 20a once again to form the opening Mc in the manufacturing method of the organic EL display device 70 of the first embodiment.

As described above, according to the organic EL display device of the present embodiment, in the inorganic insulating film 20a on the first flattening film 19a, the opening Mc is provided so as to pass through the inorganic insulating film 20a in the image capturing region Dc overlapping with the group of thinned-out subpixels Pb. Here, since one opening Mc is integrally provided over substantially the entire region of the image capturing region Dc, in the thinned-out subpixel Pb and the subpixel Pa adjacent to the thinned-out subpixel Pb, the moisture in the first flattening film 19a can be released from the opening Mc to an even greater extent. Accordingly, in the thinned-out subpixel Pb and the subpixel Pa adjacent to the thinned-out subpixel Pb, the oxidation of the relay electrode 21b can be suppressed to an even greater extent. As a result, the electrical connection between the relay electrode 21b and the first electrode 31a is improved, and the lighting failure can be suppressed to an even greater extent.

Further, according to the organic EL display device of the present embodiment, since the inorganic insulating film 20a is provided on the first flattening film 19a, when the second wiring line layer such as the power source line 21a is patterned by dry etching, the etching of the surface of the first flattening film 19a is suppressed, and thus, the contamination in the chamber of the dry etching device can be suppressed.

Other Embodiments

In each of the embodiments described above, the organic EL layer having a five-layer structure including the hole injection layer, the hole transport layer, the light-emitting layer, the electron transport layer, and the electron injection layer is exemplified, but the organic EL layer may have a three-layer structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

In each of the embodiments described above, the organic EL display device in which the electrode of the TFT connected to the first electrode serves as the drain electrode is exemplified. However, the disclosure is also applicable to an organic EL display device in which the electrode of the TFT connected to the first electrode is referred to as the source electrode.

In each of the embodiments described above, the organic EL display device is exemplified as a display device. The disclosure can also be applied to a display device including a plurality of light-emitting elements driven by a current, for example, to a display device including quantum dot light-emitting diodes (QLEDs), which are a light-emitting element using a quantum dot-containing layer.

INDUSTRIAL APPLICABILITY

As described above, the disclosure is useful for a flexible display device.

The invention claimed is:

1. A display device comprising:

a display panel including:

a base substrate layer, a thin film transistor layer provided on the base substrate layer, and formed by a first wiring line layer, a first flattening film, an inorganic insulating film, a second wiring line layer, and a second flattening film, sequentially layered in this stated order, a light-emitting element layer provided on the thin film transistor layer, and formed by a plurality of first electrodes, a plurality of light-emitting function layers, and a common second electrode, sequentially layered in this stated order, so as to correspond to a plurality of subpixels that forms a display region, and a sealing film provided on the light-emitting element layer, wherein:

the plurality of subpixels is divided into a group of normal subpixels, and a group of thinned-out subpixels that is surrounded by the group of normal pixels and that is thinned out compared to the group of normal subpixels, in the inorganic insulating film, an opening that passes through the inorganic insulating film is provided in a region overlapping corresponding to the group of thinned-out subpixels, and in an entirety of the opening, the first flattening film and the second flattening film directly contact each other.

2. The display device according to claim 1, wherein a plurality of the openings, including the opening, is provided, each of the plurality of openings having a dot-like shape.

3. The display device according to claim 2, wherein the plurality of the openings includes a plurality of first openings provided along a boundary between the group of normal subpixels and the group of thinned-out subpixels, and a plurality of second openings provided around each of the group of thinned-out subpixels.

4. The display device according to claim 3, wherein the thin film transistor layer includes a terminal electrode of a thin film transistor provided as the first wiring line layer, and a relay electrode provided as the second wiring line layer, and the relay electrode is electrically connected to a corresponding first electrode of the plurality of first electrodes in each of the plurality of subpixels.

5. The display device according to claim 4, wherein, in each of the group of normal subpixels, a contact hole is formed in the first flattening film and the inorganic insulating film to electrically connect the terminal electrode and the relay electrode to each other, and a center-to-center distance in a plan view between each of the plurality of first openings and a contact hole of a respective normal subpixel of the group of normal subpixels closest to each of the plurality of first openings is 50 μm or less.

6. The display device according to claim 4, wherein, in each of the group of thinned-out subpixels, a contact hole is formed in the first flattening film and the inorganic insulating film to electrically connect the terminal electrode and the relay electrode to each other, and a center-to-center distance in a plan view between each of the plurality of second openings and a contact hole of a respective thinned-out subpixel of the group of thinned-out subpixels corresponding to each of the plurality of second openings is 50 μm or less.

7. The display device according to claim 1, wherein the opening is provided in a belt-like shape.

8. The display device according to claim 7, wherein the display panel further includes a plurality of openings, including the opening, and includes a first opening provided in a U-shape along a boundary between the group of normal subpixels and the group of thinned-out subpixels, and a set of second openings provided in a frame-like shape around each of the thinned-out subpixels.

9. The display device according to claim 1, wherein the opening is a single opening integrally provided in the region corresponding to the group of thinned-out subpixels.

10. The display device according to claim 1, wherein the thin film transistor layer includes, on a base substrate layer side of the first wiring line layer, a semiconductor layer, a gate insulating film, a third wiring line layer, a first interlayer insulating film, a fourth wiring line layer, and a second interlayer insulating film sequentially layered, in this stated order, from the base substrate layer side toward a first wiring line layer side.

11. The display device according to claim 1, wherein the display region is provided in a rectangular shape, and the region corresponding to the group of thinned-out subpixels is provided in an intermediate portion along one side of the display region.

12. The display device according to claim 1, wherein each of the plurality of light-emitting function layers comprises an organic electroluminescence layer.

* * * * *